United States Patent
Liu et al.

(10) Patent No.: US 12,387,902 B1
(45) Date of Patent: Aug. 12, 2025

(54) ELECTRODE AND FILAMENT COUPLED BY ADAPTER

(71) Applicant: FEI Company, Hillsboro, OR (US)

(72) Inventors: Kun Liu, Portland, OR (US); Joshua Mutch, Salem, OR (US)

(73) Assignee: FEI Company, Hillsboro, OR (US)

( * ) Notice: Subject to any disclaimer, the term of this patent is extended or adjusted under 35 U.S.C. 154(b) by 70 days.

(21) Appl. No.: 18/665,386

(22) Filed: May 15, 2024

(51) Int. Cl.
*H01J 37/073* (2006.01)
*H01J 1/304* (2006.01)
*H01J 9/02* (2006.01)
*H01J 37/285* (2006.01)

(52) U.S. Cl.
CPC .......... *H01J 37/073* (2013.01); *H01J 1/3044* (2013.01); *H01J 9/025* (2013.01); *H01J 37/285* (2013.01); *H01J 2201/30492* (2013.01); *H01J 2209/0223* (2013.01); *H01J 2237/06341* (2013.01)

(58) Field of Classification Search
CPC ......... H01J 37/073; H01J 1/3044; H01J 9/025
See application file for complete search history.

(56) References Cited

U.S. PATENT DOCUMENTS

| | | | |
|---|---|---|---|
| 3,631,291 A * | 12/1971 | Favreau | H01J 1/304 313/345 |
| 4,258,283 A | 3/1981 | Brünger et al. | |
| 8,952,605 B2 | 2/2015 | Zhang et al. | |
| 9,070,527 B2 | 6/2015 | Yasuda | |
| 11,651,924 B1 | 5/2023 | Liu et al. | |
| 2019/0066966 A1 | 2/2019 | Kusunoki et al. | |
| 2021/0305006 A1* | 9/2021 | Liu | H01J 37/28 |
| 2022/0293387 A1* | 9/2022 | Liu | H01J 1/3044 |

FOREIGN PATENT DOCUMENTS

EP 2680294 B1 9/2015

OTHER PUBLICATIONS

Inoue et al., "Growth and surface properties of lanthanum hexaboride crystals," *Journal of Vacuum Science & Technology,* vol. 21, No. 4, pp. 952-956 (Nov. 1982).

\* cited by examiner

*Primary Examiner* — Joseph L Williams
(74) *Attorney, Agent, or Firm* — Klarquist Sparkman, LLP

(57) ABSTRACT

Apparatus and methods are disclosed for a mechanically stable, long-life, cold field emitter assembly which is compatible with ultra-high vacuum and occasional high-temperature flashing. A metal adapter is welded between a hexaboride electrode and a metal filament. Some embodiments use a tungsten filament, a tantalum adapter, and a LaB6 microrod electrode with a nanorod emitter tip. Other material combinations are disclosed, as also usage in electron sources for electron microscopes. In variations, the adapter is deposited onto the filament and the electrode then welded to the adapter.

11 Claims, 7 Drawing Sheets

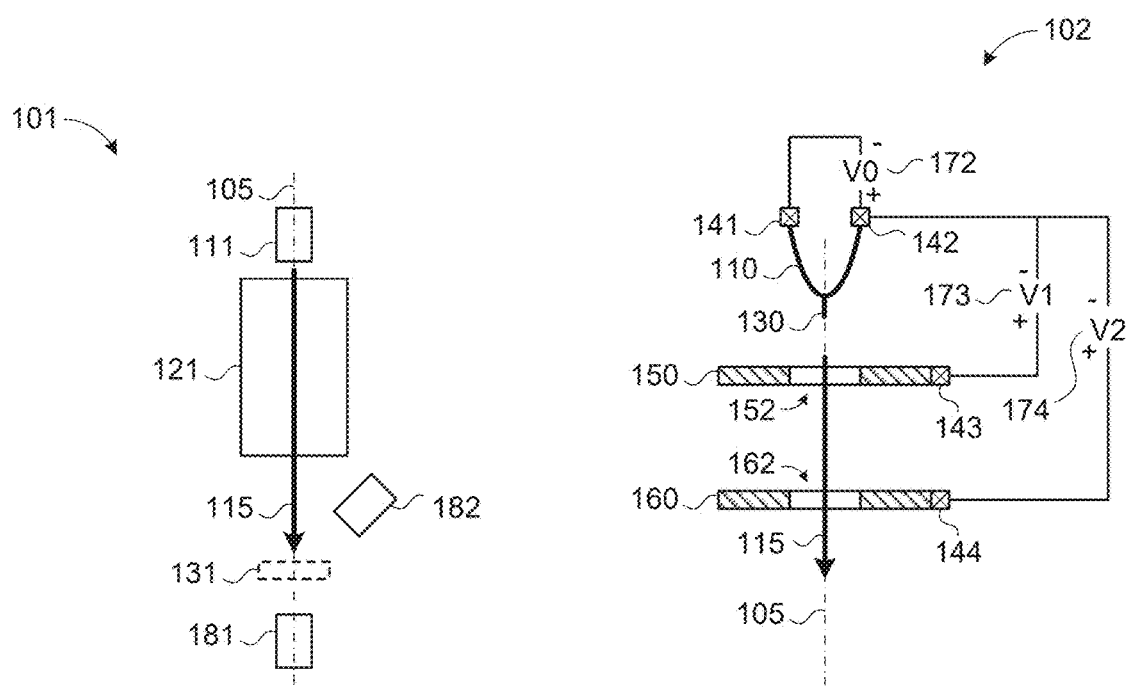
FIG. 1A  FIG. 1B
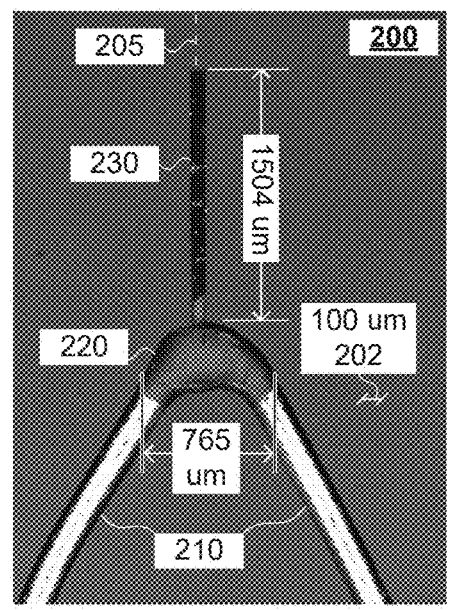
FIG. 2 (PRIOR ART)

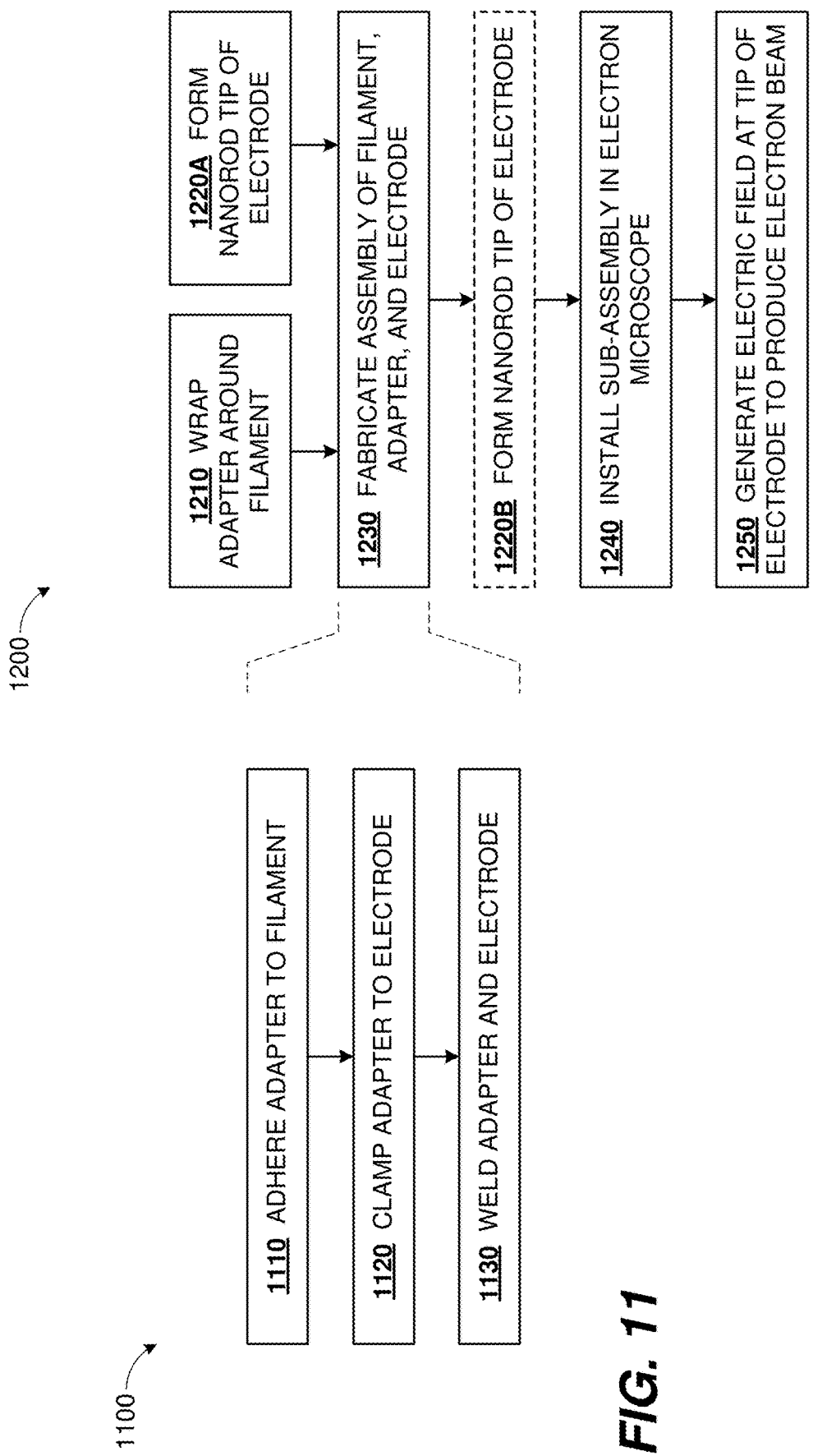

ELECTRODE AND FILAMENT COUPLED BY ADAPTER

FIELD

The disclosure pertains to electron sources.

BACKGROUND

Cold field emission electron sources, operating at or near room temperature, offer higher brightness, better beam coherency, greater positional stability, and longer lifetime as compared to sources operating at elevated temperatures, and is very attractive for use in high-resolution electron microscopes such as S/TEM, SEM, and other applications. Lanthanum hexaboride ("LaB6") is a refractory ceramic with good electrical conductivity and low work function. LaB6 cold field emitters have demonstrated stable emission in a moderate vacuum of ~$10^{-10}$ torr and show great potential for next-generation-cold field emission sources. However, material incompatibility between LaB6 and commonly used emitter support materials can result in erosion over time. Some conventional approaches to overcome this issue use graphite paste to bond LaB6 to a support without direct contact between the LaB6 and the support. The graphite paste, if a large amount is present, can create a trapped gas reservoir that makes it difficult to operate the source in ultra-high vacuum and that can also contaminate the LaB6 emitter during source operation. Accordingly, there is a need for improved technologies to implement LaB6 cold field sources for efficient, stable operation over long lifetimes.

SUMMARY

In brief, examples of the disclosed technologies employ an adapter to couple an electrode to a supporting filament. Respective fusion zones bond the adapter to the electrode and to the filament. Illustratively, a LaB6 electrode can be attached to a tungsten filament through a tantalum adapter, however other materials and combinations can be used. Fusion zones can be formed by spot welding or laser welding without filler material, to obtain an emitter assembly which is mechanically stable and compatible with ultra-high vacuum.

In other examples, welding can be used to form a fusion zone between adapter and electrode, and another technique can be used to assemble the adapter and filament. Illustratively, a tantalum adapter can be formed by deposition onto the filament.

The foregoing and other objects, features, and advantages of the invention will become more apparent from the following detailed description, which proceeds with reference to the accompanying figures.

BRIEF DESCRIPTION OF THE DRAWINGS

FIGS. 1A-1B are diagrams of an electron microscope and its electron source in which examples of the disclosed technologies can be applied.

FIG. 2 is an image of a conventional emitter structure.

FIG. 11 is a flowchart of a first example method according to the disclosed technologies.

FIG. 12 is a flowchart of a second example method according to the disclosed technologies.

DETAILED DESCRIPTION

Introduction

Figure 3A:
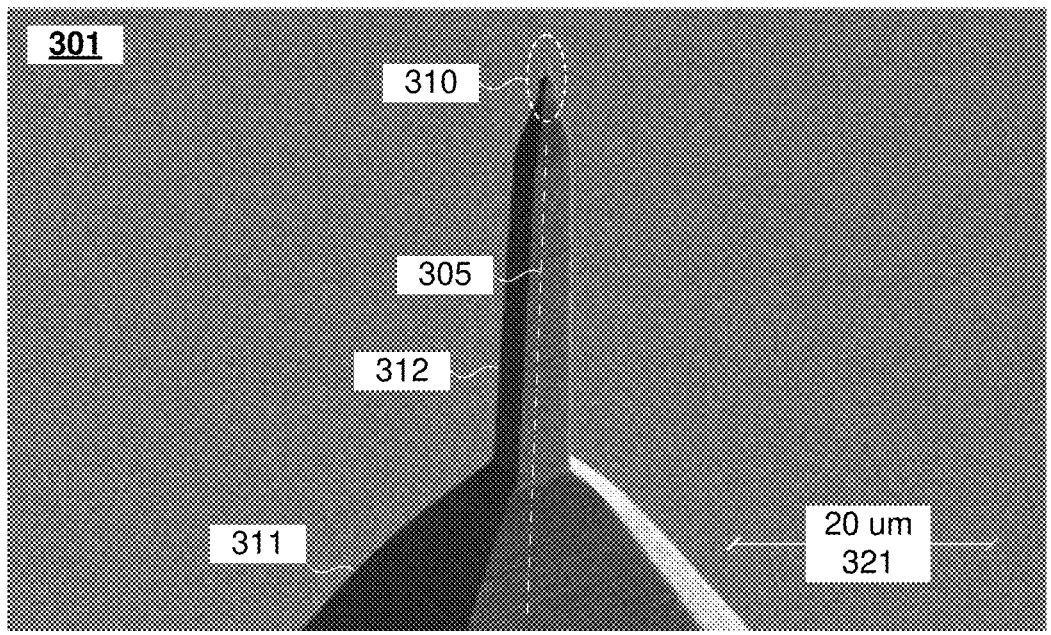
FIGS. 3A-3B are SEM images of a LaB6 electrode having a nanorod tip, which can be incorporated into examples of the disclosed technologies.

Electron microscopes are widely used for material and device analysis, and also for biological studies. Various configurations are used, including SEM, TEM, and STEM. In all these configurations, an electron beam is generated by an electron source and delivered to a sample. Electron sources commonly utilize thermionic emission, Schottky emission or cold field emission. Cold field emission can be advantageous for providing higher brightness, lower energy spread, better coherency and longer lifetime, primarily because of low temperature ($\leq 300K$) operation and appearing as a smaller virtual source than other emitter types. Electron energy spreads of about 0.2~0.3 eV and practical brightness >$10^9$ A/(sr.m$^2$.V) can be achieved from a cold field emitter. A cold field emission source commonly has an electrode with a tip (dubbed "emitter") with a few to a few hundred nanometers transverse extent, at which electron emission can occur under influence of an externally applied electric field.

Lanthanum hexaboride (LaB6) is an attractive material for cold field emitters owing to its low work function, high electrical conductivity, and especially has demonstrated stable cold emission in a moderate vacuum of ~$10^{-10}$ torr. As a ceramic material, LaB6 can be fabricated into nanorod tips and can withstand high temperatures. Other rare-earth hexaborides can also be used.

However, considerations of material compatibility, vacuum compatibility, and mechanical stability have adversely impacted performance. Notably, while cold field emitters can be operated at room temperature for electron microscopy, cleaning the emitter in situ is often conducted by resistively heating the emitter assembly, which is also termed "thermal flashing". For effective heating, it can be desirable to mount the emitter electrode directly onto a filament. Tungsten, with its high melting point, is a common emitter filament material; it is able to generate and withstand high temperatures in excess of 2000° C. without causing mechanical issues.

However, tungsten and LaB6 may not bond well directly. A joint between tungsten and LaB6 can be prone to erosion and atomic migration (particularly at high cleaning temperatures), which can lead to mechanical drift or joint failure.

Some examples of the disclosed technologies use an adapter made of tantalum to couple the filament (e.g. tungsten) and electrode (e.g. LaB6). Tantalum offers good compatibility with LaB6, with low rate of joint degradation. As a metal, tantalum is vacuum compatible, and can be welded without filler to both tungsten and LaB6. Like LaB6 and tungsten, tantalum has a high melting point. Thus, a welded assembly of a tungsten filament, a tantalum adapter, and a LaB6 filament can tolerate high temperatures, can support ultra-high vacuum (e.g. below 4×10$^{-10}$ torr) with low outgassing, and can provide exceptional mechanical stability with periodic thermal flashings in a range 600 K-2200K.

The choices of materials described above are exemplary. Other material combinations can perform similarly. For example, filament materials can include tungsten alloys, rhenium, or rhenium alloys. Adapter materials can include tantalum or tantalum alloys. Electrode materials can include other hexaborides. Other filament, adapter, or electrode materials can also be used with the disclosed technologies. In variations, tungsten alloy filament materials can be used to selectively control filament resistivity, mechanical filament strength, or weld reliability.

FIGS. 1A-1B are diagrams of an electron microscope 101 and an electron source 102 in which examples of the disclosed technologies can be applied. Electron source 111, electron optics 121 and sample 131 can be positioned along axis 105. Source 111 can produce electron beam 115 which can be shaped by optics 121 and delivered to sample 131. Detector 181 can detect transmitted electrons, e.g. in a TEM or STEM configuration, while detector 182 can detect secondary particles, e.g. in an SEM configuration. Sample 131 is not part of the illustrated electron microscope and shown in dashed outline. Furthermore, a given electron microscope can have just one among detectors 181 or 182.

FIG. 1B is a schematic diagram of an electron source 102 which can incorporate disclosed technologies. Electron source 111 can be implemented as shown in FIG. 1B.

Emitter 130 can be mounted to filament 110 using any of the technologies described herein. An adapter and various emitter details are omitted from FIG. 1B for simplicity of illustration. Emitter 130 can produce electron beam 115 along centerline 105 in conjunction with anodes 150, 160. Centerline 105 passes through apertures 152, 162 of extraction anode 150 and acceleration anode 160 respectively.

Electron source 102 can incorporate at least four electrical terminals 141-144. Power supply 172 can be coupled to terminals 141-142 to drive current through filament 110 for thermal conditioning of electron source 102. Power supply 173 can apply extraction voltage V1 between emitter 130 (coupled to terminal 142) and terminal 143 of extraction anode 150. Power supply 176 can apply an acceleration voltage V2-V1 between extraction anode 150 and terminal 144 of acceleration anode 160.

FIG. 2 is an image 200 of a conventional emitter structure, prior to tip formation. Dimensions are according to scale 202. Because graphite is unsuitable for welding, a bead of water-based graphite paste 220 can be applied to bond with filament 210, and electrode 230 can be affixed to graphite paste 220 to form an emitter assembly. A substantial mass of water-based graphite paste 220 can be required to support the mass of electrode 230 which, as shown, has a thickness ≥50 μm and length >1.2 mm. Graphite has good material compatibility with LaB6. But, as the water evaporates from paste 220 during room-temperature curing, pumping, baking, and emitter flashing, trapped pockets of gas can be left behind, which can continue to release gas over time, degrading vacuum conditions around the electron source and leading to emitter contamination. The disclosed technologies can eliminate graphite paste altogether, thereby providing improved performance.

Figure 3B:
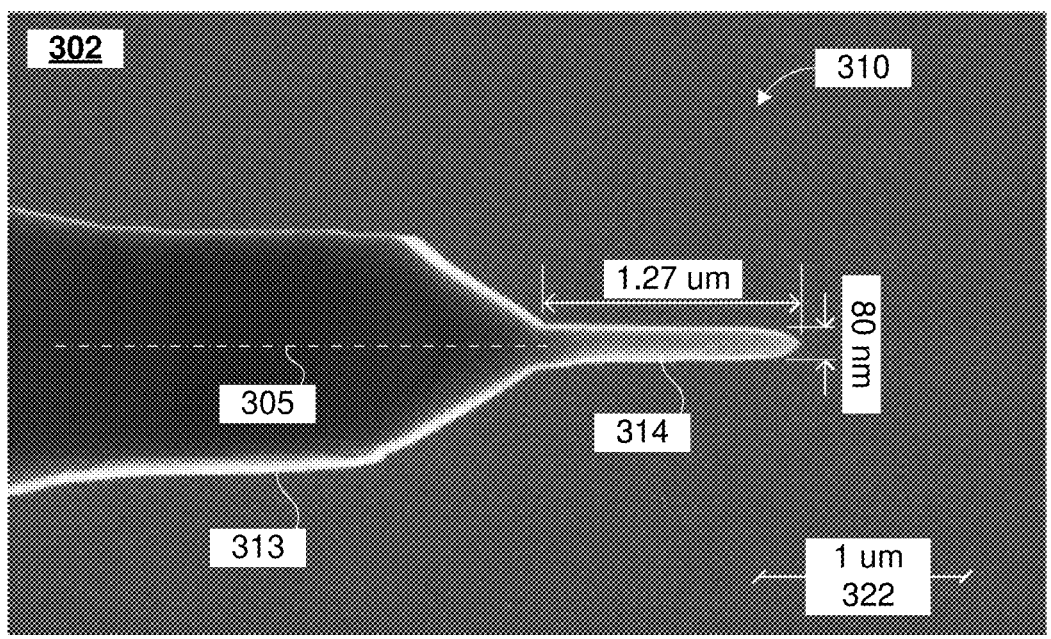

FIGS. 3A-3B are SEM images 301, 302 of an example LaB6 electrode having a nanorod tip, which can be incorporated into disclosed emitter assemblies. The illustrated electrode has a microrod structure with a nanorod emitter tip. The diameter of the illustrated electrode is stepped from about 100 μm to about 80 nm in stages (tiers). Shaping of a microrod to form a nanorod tip can be done by ion milling, e.g. using a focused ion beam (FIB) tool.

Initially, a generally square microrod of about 100 μm diameter (see e.g. microrod 740 of FIG. 7) can form a first tier, which can be tapered at its distal end, as seen in shoulder 311 of FIG. 3A. Second tier 312 can be a microrod section about 5 μm diameter and about 30 μm long, with another shoulder leading to nanorod tip 310, which is shown in further detail in FIG. 3B. In this example, tip 310 has third and fourth nanorod tiers 313, 314. As illustrated, tier 313 has a length about 1.6 μm and a diameter about 500 nm, and tier 314 has a diameter about 80 nm and a length about 1.27 μm. Moreover, as shown, tier 314 has a pointed tip. In this example, the tip radius is about 10 nm.

Terminology

An "adapter" is a physical component coupling two other components. In some disclosed examples, adapters are tantalum or tantalum alloys, and are used to couple a filament and an electron electrode in an electron emitter assembly.

The term "atomic percent" (or, "at %") denotes the percentage of atoms in a given device or material which are a particular element or set of elements. Thus, atomic percent can be applied to a single element such as boron, a series in the periodic table such as rare-earth elements or lanthanides, a group of elements such as halogens, a block of the periodic table such as transition metals, or another particular set of elements. A similar term "weight percent" (or, "wt %") denotes the percentage of weight contributed by a particular element or set of elements.

As a verb, "clamp" refers to an act of holding two physical objects together by reversible application of a force. Inasmuch as welding, soldering and gluing are not reversible-requiring different unrelated acts for assembly and disassembly-they are not considered as clamping acts. As a noun, "clamp" is an apparatus which can reversibly exert a force on two physical objects to hold them together.

As a noun, "current" refers to "electrical current," namely a flow of charged particles. While currents can sometimes flow through a wire or other electrically conductive material, this is not a requirement. An electron beam is an example of current flowing in a vacuum.

The term "cylindrical" describes an elongated object (a "cylinder") having a uniform cross-sectional shape over a length at least three times a maximum transverse extent (dubbed "diameter") of that cross-sectional shape. A "wire" is an electrically conductive cylinder. While some cylindrical objects described herein have generally circular cross-section, this is not a requirement. For example, various microrods or nanorods shown herein have square cross-sections and are also cylinders. Rectangular microrod cylinders (e.g. 50 μm×100 μm cross-section) can also be used. The length of a cylinder can be measured along its "axis," which is a line joining centroids of successive cross-sections. The axis need not be a straight line: a cylinder (e.g. filament 110) can have bends. The requirement for uniform cross-sectional shape means that diameter and cross-sectional area vary by at most a factor of 1.5 over the requisite length. However, a cylinder can have twists about its axis while maintaining a uniform cross-sectional shape. Some electrodes of interest herein (see FIGS. 3A-3B) can have piecewise cylindrical sections joined e.g. by taper sections which may not be cylinders.

As a verb, "deposit" refers to an act of affixing particulate material as a layer on a physical object. In some examples, this act can be formed by physical or chemical vapor deposition, sputtering, plating, or powder-based additive manufacturing. Inasmuch as lamination, wrapping, or welding apply a bulk material (rather than particulate material) to a physical object, they are not considered to perform deposition.

"Electric field" is a manifestation of electrical energy stored in a volume, whereby charges within the volume or at a boundary of the volume experience a force. Commonly, application of a voltage between two objects can produce an electric field in the region between the objects. Electric fields can also be present in propagating electromagnetic energy, such as a laser beam.

An "electrode" is an electrically conductive object through which charged particles flow to or from vacuum, gas, or another fluid. Although electrodes can often be metallic, this is not a requirement. Of interest in disclosed examples are LaB6 electrodes operating as field emission sources of electrons.

An "electron emitter" (or simply "emitter") is a device usable as a source of electrons in an electron microscope or other equipment. The device need not actually be emitting electrons to be regarded as an electron emitter. Electron emitters commonly operate via cold field emission, in which electrons can be pulled off the emitter by strong electric fields (e.g. at room temperature or temperatures below 200° C.), or thermionic and Schottky emission, in which electrons can achieve sufficient energy from both thermal and electrical to overcome a work function of an electrode material and thus escape from the electrode. As used herein, the terms emitter and electron emitter can refer to a portion (e.g. 314) of an electrode from which electron emission occurs, the electrode can be an integral object in which an emitter can be formed, and an "emitter structure" or "emitter assembly" can refer to an assembly of the electrode with one or more other objects (e.g. filament or adapter; see FIG. 4), including an unfinished assembly lacking a nanorod emitter tip.

A "filament" is an electrically conductive device usable to convert electrical energy (e.g. current flowing through the filament) into heat. The device needs not actually be generating heat to be regarded as a filament.

A "fusion zone" is a region at a boundary between two welded objects having material from the two objects mixed together. Thus, if the two objects have distinct compositions, a local material composition within the fusion zone can be distinct from the composition of either object.

"Install" refers to an act of incorporating an object into an assembly of multiple objects.

A "microrod" is an elongated structure whose largest transverse dimension is in a range 1-500 µm. A "nanorod" is an elongated structure whose largest transverse dimension is in a range 1-1000 nm. Some electrodes of interest herein are microrods having nanorod tips. Some microrods and nanorods described herein are cylinders, e.g. with square or rectangular cross-section, but that is not a requirement.

The term "pulse" refers to a waveform having finite temporal extent and continuous over that extent, having a mean value over that extent, and crossing that mean value exactly twice, e.g. once while rising and once while falling. To illustrate, electrical current, laser energy, or other forms of energy can be applied as pulses.

A "terminal" is an attachment point of an electrical component. Voltage or current signals can flow to or from the electrical component through the terminal.

"Thickness" refers to a longitudinal dimension of an object in a direction of current flow, energy flow, or application of clamping force.

As a verb, "weld" refers to an act of joining two physical objects by application of energy, so as to melt proximate portions of the two objects, resulting in their being joined together after the melted portions cool and solidify. Molten material of the two objects can mix to form a fusion zone. Inasmuch as brazing and soldering do not melt portions of both objects, they are not considered to be welding. Welding can be done with or without a filler material, the latter dubbed "autogenous." Some examples of the disclosed technologies employ light energy to cause melting, e.g. "laser welding." Other examples employ electrical energy to cause melting, e.g. "spot welding." Both laser welding and spot welding can be autogenous. As a noun, "weld" refers the regions of the welded object that were in molten state during the welding operation. At least a portion of a weld can be a fusion zone. Welds formed by spot welding or laser welding are termed "spot welds" or "laser welds" respectively. In some examples, energy deposited in a single welding operation can be distributed over multiple object boundaries, resulting in multiple object pairs being welded simultaneously.

As a verb, "wrap" refers to an act of bending a sheet object about another object at least to where the sheet object comes in contact with itself. In some disclosed examples, an adapter can be implemented as a foil wrapped around a filament.

Example Emitter Structures

Figure 4:
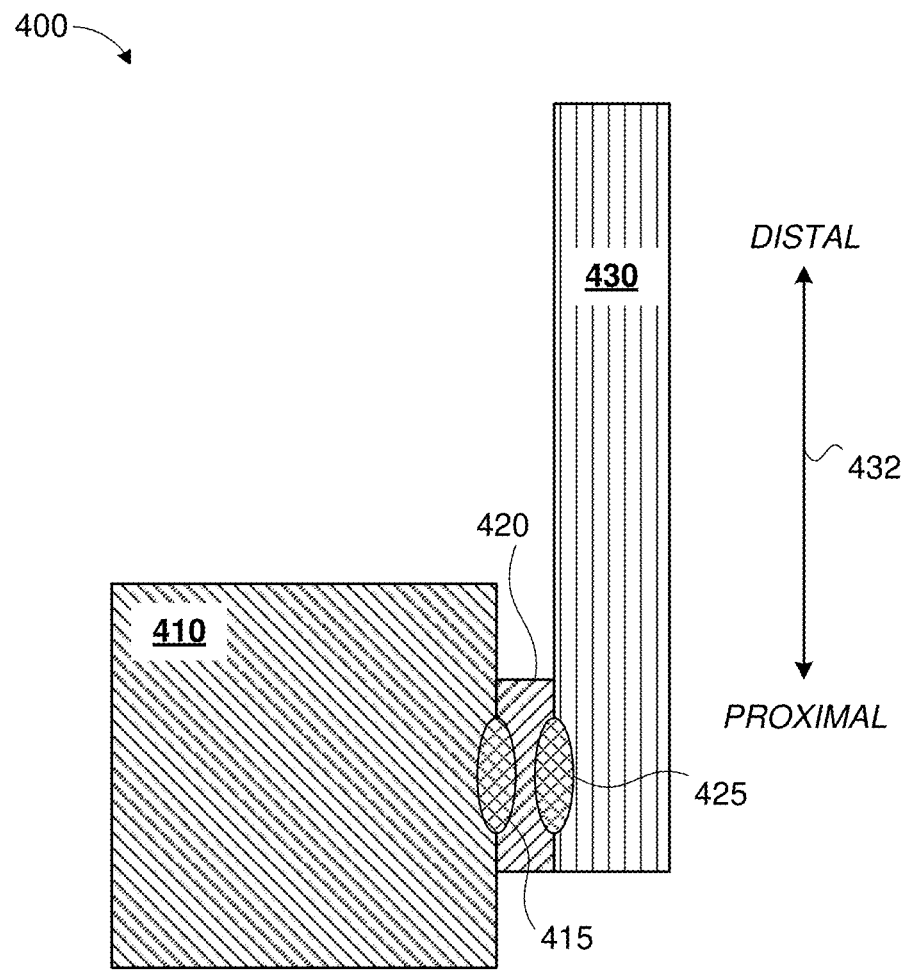
FIG. 4 is a cross-section view of an example emitter structure according to the disclosed technologies.

FIG. 4 is a cross-section view 400 of an example structure according to the disclosed technologies. In this structure, adapter 420 can be coupled to filament 410 by first fusion zone 415, and can be coupled to emitter electrode 430 by second fusion zone 425. The material of adapter 420 can have superior interfacial properties with respect to one or both of filament 410 and electrode 430, and problems of erosion or mechanical instability in a direct electrode-filament joint can be avoided. Furthermore, a joint in the form of a fusion zone, characteristic of welds, can provide a structure that is compatible with ultra-high vacuum and free of outgassing problems associated with some other forms of joints.

In some examples, filament 410 can incorporate at least 50 at %, 80 at %, or 90 at % of tungsten, of rhenium, or of a tungsten-rhenium alloy. A portion of filament 410 bordering first fusion zone 415 can be a cylindrical wire having a maximum transverse extent in a range 25-500 µm.

Filament 410 and adapter 420 can have distinct material compositions. Adapter 420 can incorporate at least 80 at %, 90 at %, 95 at %, 98 at %, or 99 at % of tantalum. Generally planar embodiments of adapter 420 (see e.g. FIGS. 9-10) can have a thickness in a range 1-500 µm, 5-100 µm, 25-125 µm, 10-50 µm, or 20-30 µm. Other adapters 420 (see e.g. FIGS. 7-8) can have a distance between a centroid of first fusion zone 415 and a centroid of second fusion zone 425 in any of those ranges.

Electrode 430 can incorporate at least 60 at %, 80 at %, or 85 at % of boron. Electrode 430 can incorporate a hexaboride material, such as a rare-earth hexaboride, a hexaboride of a lanthanide, or particularly LaB6. A portion of electrode 430 adjacent to second fusion zone 425 can be a microrod leading to a nanorod tip at a distal end of electrode 430. Arrow 432 illustrates distal and proximal directions of electrode 430 relative to the emitter assembly shown.

The combination of tungsten filament, tantalum foil adapter, and LaB6 electrode has particular advantages in combining the stiffness of tungsten, the material compatibility of tantalum, and low work function of LaB6. This combination can be welded, and all components can tolerate very high temperatures of 2000° C. and above. An emitter tip with negligible positional drift under periodic thermal flashes at ≤2200K can be achieved.

First fusion zone 415 can incorporate an admixture of a first material (e.g. tungsten) of the filament (e.g. 410) and a second material (e.g. tantalum) of the adapter (e.g. 420). Second fusion zone 425 can incorporate an admixture of the second material (e.g. tantalum) of the adapter (e.g. 420) and a third material (e.g. LaB6) of the electrode (e.g. 430). First fusion zone 415 or second fusion zone 425 can be a weld, such as a spot weld or a laser weld. Inasmuch as a fusion zone can have distinct composition from either joined object, the fusion zone can be a distinct component of an assembled structure.

An electron source similar to 102 of FIG. 1B can incorporate the structure of FIG. 4. Electron emission can occur at a (distal) tip of electrode 430, the tip thereby being an emitter (similar to 130). A beam of electrons (115) can be emitted generally oriented along a centerline (105) of the tip. The electron source can additionally include an extraction anode (150) having an aperture (152) through which the tip's centerline passes. Application of an extraction voltage (V1) between the structure (tip) and the extraction anode can create an electric field at the tip strong enough to pull electrons off the tip, toward the extraction anode. An acceleration anode (160) can be positioned downstream of the extraction anode, also with an aperture (162) through which the tip's centerline passes. A voltage difference (V2-V1) between the extraction anode and the acceleration anode can create an electric field causing emitted electrons passing through the extraction anode's aperture to be further accelerated toward the acceleration anode and, in turn, to pass through the acceleration anode's aperture toward a target (131).

The electron source can incorporate at least four electrical terminals (141-144) through which voltages or currents can be applied to operate the electron source, including (i) current through the filament (110), (ii) an extraction voltage applied to the extraction anode, relative to the emitter structure, and (iii) an acceleration voltage applied to the acceleration anode, relative to the extraction anode.

Still further, this electron source, which incorporates the structure of FIG. 4, can itself be installed in an electron microscope similar to that of FIG. 1A.

Figure 5:
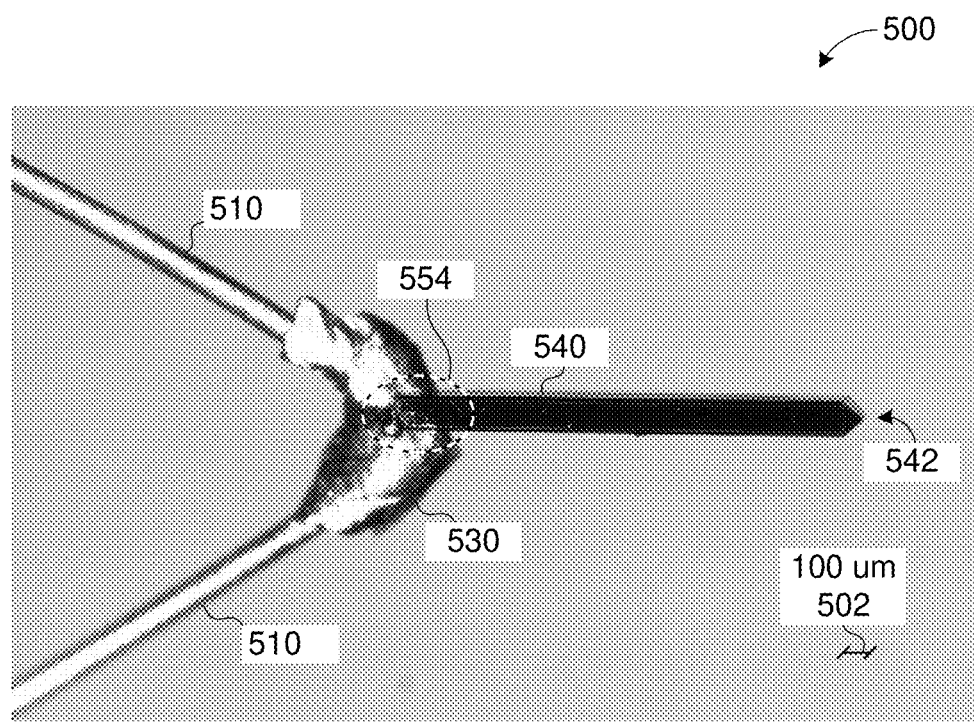
FIGS. 5-6 are microphotographs of example emitter structures according to the disclosed technologies.
Figure 6:
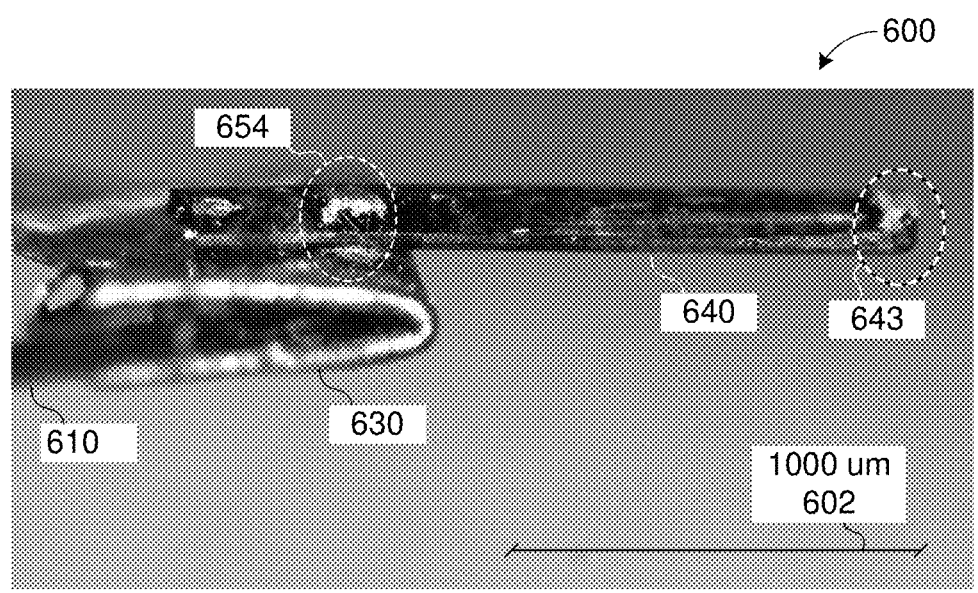

FIGS. 5-6 are microphotographs 500, 600 of example emitter structures, with respective scales 502, 602. In FIG. 5, tungsten filament 510 has a generally circular cross-section and is wrapped with a tantalum foil adapter 530. Filament 510 and foil 530 can be welded together, forming a fusion zone (similar to 415 of FIG. 4) not visible in FIG. 5. LaB6 electrode 540 can be welded to foil 530. Although some evidence of melting can be seen in contact region 554, the bulk of the fusion zone (425) between electrode 540 and foil 530 is hidden beneath electrode 540. Electrode 540 has tip 542, which can emit electrons under influence of an applied external electric field. In variations, other material compositions can be used for filament 510, foil 530, or electrode 540, as disclosed herein.

FIG. 6 shows another example emitter assembly. Whereas electrode 540 of FIG. 5 is symmetrically mounted with respect to two arms of filament 510, electrode 640 of FIG. 6 is mounted asymmetrically with respect to two arms of filament 610. In particular, tantalum sleeve adapter 630 has an elongated cross-section. Upon folding filament 610 and sleeve 630, a generally flat surface is presented upon which electrode 640 can be conveniently mounted. Filament 610, sleeve adapter 630, and electrode 640 can have material compositions similar to that of FIG. 5, or other compositions. Within contact region 654, edge portions of a fusion zone between electrode 640 and sleeve 630 can be seen. In FIG. 6, an emitter tip has not yet been formed at distal end 643 of electrode 640.

Figure 7:
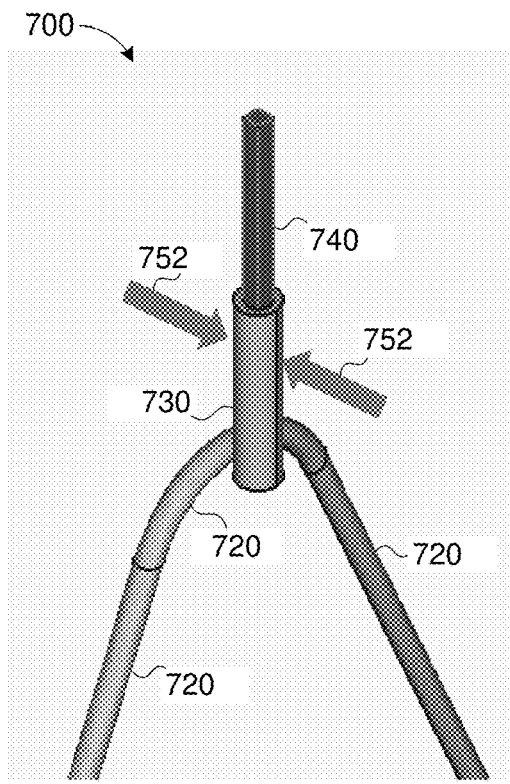
FIGS. 7-10 are diagrams of example emitter structures according to the disclosed technologies.

FIGS. 7-10 are diagrams 700, 800, 900, 1000 of additional emitter structures. In FIG. 7, filament 720 is welded to adapter 730. An upper portion of adapter 730 can be a hollow cylinder, in which electrode 740 can be inserted. Clamping force and/or welding energy can be applied in the directions shown by arrows 752 to join electrode 740 to adapter 730. The hollow cylindrical shape of adapter 730 can constrain the orientation of electrode 740, which can be advantageous for fixturing during assembly.

Figure 8:
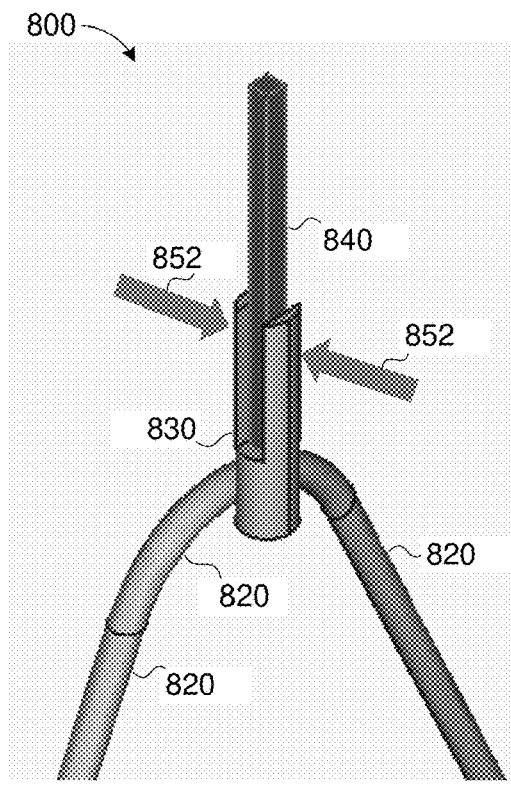

FIG. 8 shows a variation, in which an upper portion of adapter 830 has a through slot within which electrode 840 can be mounted. Filament 820 and force/energy arrows 852 are similar to their counterparts in FIG. 7 and are not further described. The slotted shape of adapter 830 allows external access to interfaces between adapter 830 and electrode 840, which can be advantageous for laser welding, e.g. with a laser beam oriented at an oblique angle to arrows 852.

FIGS. 7-8 show emitter structures for which adapter joints to a filament and to an electrode are spaced apart or not collinear, and for which an adapter-filament joint and an adapter-electrode joint can be separately formed. In contrast, FIGS. 9-10 show emitter structures in which adapter-filament and adapter-electrode joints are proximate or collinear, allowing both joints to be formed in a single welding operation.

Figure 9:
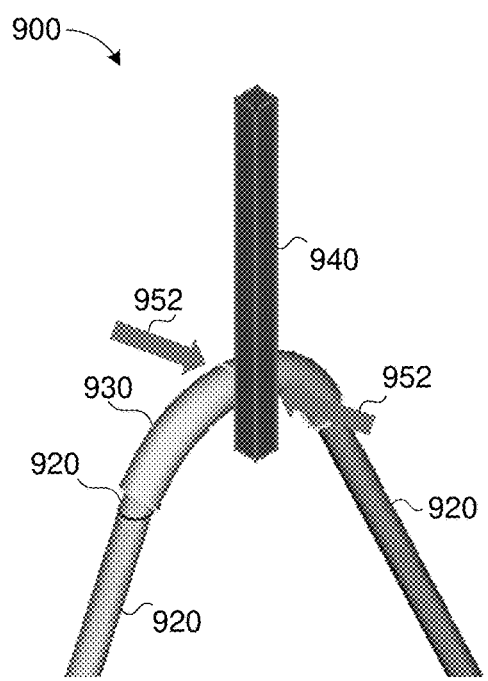

In FIG. 9, adapter 930 is formed around filament 920. Electrode 940, adapter 930, and filament 920 can all be clamped together as an assembly, with force applied in directions 952. Then adapter-filament and adapter-electrode fusion zones can advantageously be formed in a single spot welding operation, passing current through the assembly in a direction shown by either arrow 952. Alternatively, such an assembly can be welded by laser welding, optionally repositioning the laser between multiple welds.

Figure 10:
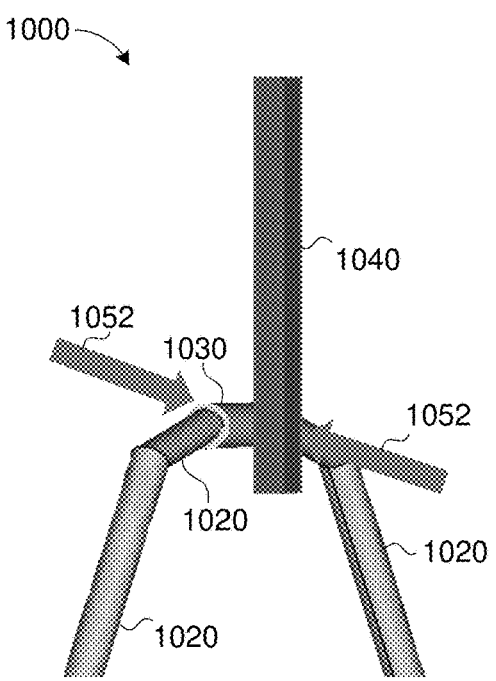

FIG. 10 illustrates a variation. Whereas in FIG. 9, adapter 930 extends along substantially the length of filament 920 (or, for over 50% of the filament's length), in FIG. 10, adapter 1030 extends along a relatively small portion of the length of filament 1020 (or, less than 50% of the filament's length). The longer sleeve of adapter 930 can be easier to manufacture and clamp for welding, and can further protect the surface of filament 920 from deterioration at high temperature. Conversely, the shorter sleeve of adapter 1030 can be more economical and can avoid vacuum issues with residual gas pockets between sleeve 1030 and filament 1020. A straight filament segment 1020 can facilitate wrapping with a tantalum foil.

Although arrows 952, 1052 suggest a single welding operation to form both adapter-filament and adapter-electrode joints, this not a requirement and, like for FIGS. 7-8, the adapter-filament and adapter-electrode joints can be formed in separate operations. For example, tantalum sleeve 930, 1030 can be clamped around filament 920, 1020 and then welded into a partial assembly, following which electrode 940, 1040 can be clamped to the partial assembly and welded to adapter 930, 1030. Alternatively, sleeve 930, 1030 can be formed by deposition onto filament 920, 1020 prior to welding electrode 940, 1040 onto sleeve 930, 1030.

Electrode 740 is shown having a square face at its distal end (e.g. at the top of drawing 700, away from adapter 730). A nanorod or pointed tip can be formed after assembling the structure shown, but this is not a requirement and, in other examples, an emitter tip can be formed on electrode 730 prior to assembling the illustrated structure. Considerations for electrodes 840, 940, 1040 are similar.

The embodiments shown herein are exemplary, and numerous other configurations can be implemented within the scope of the disclosed technologies. For example, a laminated assembly can include successive layers of: filament-adapter-electrode-adapter-filament. That is, the two outer layers can form supporting arms, and adapter layers can provide material compatibility between the electrode and both filament arms. The entire laminated assembly can be spot welded in a single welding operation.

First Example Method

FIG. 11 is a flowchart 1100 of a first example method according to the disclosed technologies. This method can be used to form an emitter assembly similar to that of FIG. 4, or variations.

At process block 1110, an adapter (similar to 420) can be adhered to a filament (410). At process block 1120, the adapter can be clamped to an electrode (430) and, at process block 1130 the adapter and electrode can be welded together.

Numerous variations and extensions of this method can be implemented within scope of the disclosed technologies, some of which are described in context of FIG. 4, FIG. 12, or elsewhere herein. The adapter can incorporate tantalum or tantalum alloys. The electrode can incorporate a rare-earth hexaboride.

The adhering of block 1110 can be performed in various ways. To form a fusion zone (similar to 415), the filament and adapter can be clamped together and welded. In some examples, the filament, adapter, and electrode can all be clamped together before any welding act is performed. Both welding acts can be performed as a single operation. One or both welding acts can be performed by electrical spot welding, or by laser welding. Either welding act, or both welding acts together, can be performed with a single temporal pulse of energy delivered to clamped objects, to avoid damage caused by a second energy pulse when an interface between the clamped objects is in a molten state.

As an alternative to clamping and welding, a deposition process can be used to form and adhere the adapter on the filament. Illustratively, chemical vapor deposition (CVD) or sputtering can be used.

Example Method Extensions

FIG. 12 is a flowchart 1200 of a second example method illustrating extensions to the first method. These extensions can be applied singly or in any combination, or can be applied with variations.

At process block 1230, an emitter assembly can be fabricated, incorporating a filament, adapter, and electrode. As indicated by dashed lines, block 1230 can be performed using the method of FIG. 11, but this is not a requirement.

In a first extension, the adapter can be wrapped around the filament at block 1210, prior to forming the assembly at block 1230.

Then, as illustrated in FIGS. 3A-3B, a cold field emitter can incorporate a nanorod tip (310, 311) at a distal end of a microrod electrode. In varying examples of a second extension, the nanorod tip can be performed at block 1220A before assembly of the emitter structure at block 1230 or, optionally, at block 1220B after the emitter structure has been assembled. Block 1220B is shown in dashed outline to indicate that it is an alternate to block 1220A.

As a third extension, the emitter assembly can be installed at block 1240 in an electron microscope and, as a further extension, at block 1250 an electric field can be generated at the electrode tip to draw electrons off the electrode and produce an electron beam.

Welding Examples

Figure 13:
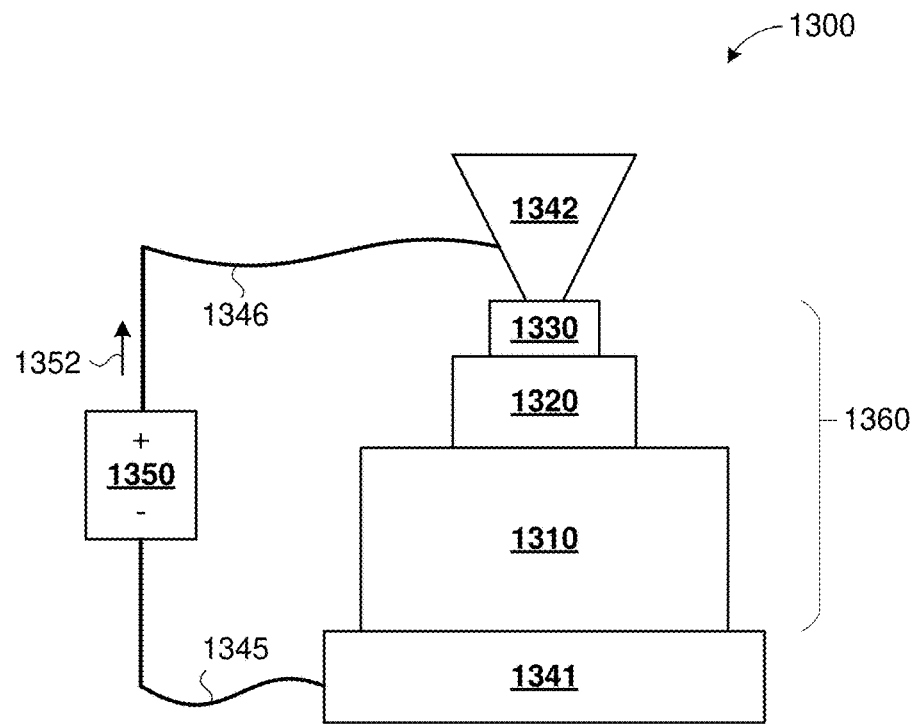
FIG. 13 is a diagram of an example setup for spot welding components of an emitter structure according to the disclosed technologies.

FIG. 13 is a diagram 1300 of an example setup for spot welding components of an emitter assembly. As shown, filament 1310, adapter 1320, and electrode 1330 can be aligned and held between welding terminals 1341, 1342. Clamping force can be kept to a minimum to mitigate risk of cracking electrode 1330. One or both of terminals 1341, 1342 can be spring-loaded. Power supply 1350 can drive current 1352 in a circuit through wires 1345, 1346, terminals 1341, 1342, and aligned devices 1310, 1320, 1330, thereby forming fusion zones similar to 415, 425 of FIG. 4. Illustratively, terminal 1341 can be a plate upon which assembly 1360 is supported, while terminal 1342 can be in the form of a pointed probe tip. Advantages of spot welding include a single setup operation for clamping and energy delivery, energy delivery concentrated at the interfaces to be welded (which can have high contact resistance), minimal access (just two wires) required for the welding equipment, and avoidance of a filler material.

Numerous variations and extensions can be implemented within scope of the disclosed technologies. Current 1352 can flow in the opposite direction. Clamping and spot welding operations can be performed on just adapter 1320 and electrode 1330, or just on adapter 1320 and filament 1330. In examples, welding can be performed with 1-10 J electrical energy (often 3-6 J) delivered to assembly 1360, in a current pulse having duration of 50-500 ms (or about 150 ms) and full width half maximum 10-200 ms (or about 40 ms).

Figure 14:
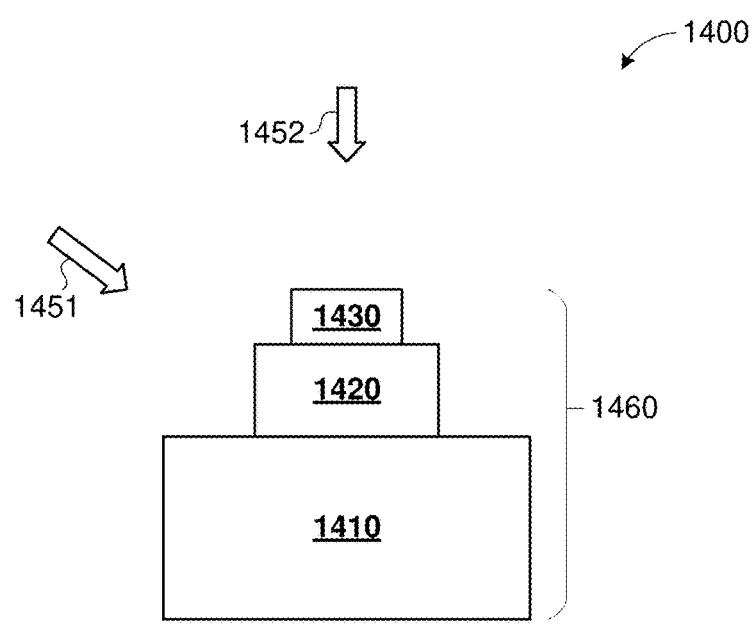
FIG. 14 is a diagram of an example setup for laser welding components of an emitter structure according to the disclosed technologies.

FIG. 14 is a diagram 1400 of an example setup for laser welding emitter components according to the disclosed technologies. As shown, filament 1410, adapter 1420, and electrode 1430 can be clamped together (clamps not shown) as assembly 1460. A laser beam can be directed onto selected regions of the assembly from different orientations, illustrated by arrows 1451, 1452. Deposited laser energy can cause melting of adjoining portions of adapter 1420 and electrode 1430, resulting in formation of a fusion zone similar to 425 of FIG. 4. Similarly, deposited laser energy can cause melting of adjoining portions of adapter 1420 and filament 1410, resulting in formation of a fusion zone similar to 415. Advantages of laser welding include an ability to focus energy delivery at specific points, reduced clamping force and reduced risk of mechanical damage to assembly 1460 due to non-contact delivery of energy, and avoidance of a filler material.

Numerous variations and extensions can be implemented within scope of the disclosed technologies. In varying examples, laser energy can be scanned continuously over a region where laser energy is to be deposited; or laser energy can be deposited at one, two, or more discrete spots to cause local melting and fusion zone formation. Energy deposition amounts can be similar to those used for spot welding. One or more lasers can be used.

Additional Examples

The following are additional examples of the disclosed technologies.

Example 1 is a structure, including: a filament; an adapter; a first fusion zone coupling the filament to the adapter; an electrode; and a second fusion zone coupling the electrode to the adapter.

Example 2 includes the subject matter of Example 1, and further specifies that the filament comprises at least 50 at % tungsten.

Example 3 includes the subject matter Example 1, and further specifies that the filament comprises at least 50 at % rhenium.

Example 4 includes the subject matter of any of Examples 1-3, and further specifies that: atomic percentages of tungsten and rhenium in the filament sum to at least 50.

Example 5 includes the subject matter of any of Examples 1-4, and further specifies that: the filament comprises, adjacent to the first fusion zone, a cylindrical wire having a diameter in a range 25-500 μm and a length at least three times its diameter.

Example 6 includes the subject matter of any of Examples 1-5, and further specifies that the first fusion zone comprises an admixture of first material of the filament and second material of the adapter.

Example 7 includes the subject matter of any of Examples 1-6, and further specifies that the first fusion zone is at least part of a weld.

Example 8 includes the subject matter of any of Examples 1-7, and further specifies that the filament and the adapter have distinct material compositions.

Example 9 includes the subject matter of any of Examples 1-8, and further specifies that the adapter comprises at least 90 at % tantalum.

Example 10 includes the subject matter of any of Examples 1-9, and further specifies that the adapter has a thickness in a range 1-500 μm.

Example 11 includes the subject matter of any of Examples 1-10, and further specifies that the second fusion zone comprises an admixture of first material of the electrode and second material of the adapter.

Example 12 includes the subject matter of any of Examples 1-11, and further specifies that the second fusion zone is at least part of a weld.

Example 13 includes the subject matter of any of Examples 1-12, and further specifies that the electrode comprises at least 60 at % boron.

Example 14 includes the subject matter of any of Examples 1-13, and further specifies that the electrode comprises a hexaboride material.

Example 15 includes the subject matter of any of Examples 1-14, and further specifies that the electrode comprises a rare-earth hexaboride material.

Example 16 includes the subject matter of Example 15, and further specifies that the electrode comprises lanthanum hexaboride.

Example 17 includes the subject matter of any of Examples 1-16, and further specifies that the electrode comprises: a microrod adjacent to the second fusion zone; and at a distal end, a nanorod tip.

Example 18 is an electron source, including the structure of any of Examples 1-17, having an emitter formed at a tip of the electrode; an extraction anode having a first aperture around a centerline of the emitter; an acceleration anode having a second aperture around the centerline of the emitter; at least four electrical terminals configured to receive electrical power to: drive current through the filament; apply an extraction voltage to the extraction anode; and apply an acceleration voltage to the acceleration anode.

Example 19 is an electron microscope, including the electron source of Example 18.

Example 20 is a method, including: adhering an adapter to a filament; clamping the adapter to an electrode; and welding the adapter and the electrode.

Example 21 includes the subject matter of Example 20, and further specifies that: the adapter comprises tantalum or tantalum alloys; and the electrode comprises a rare-earth hexaboride.

Example 22 includes the subject matter of any of Examples 20-21, and further specifies that the adhering comprises: clamping the filament to the adapter; and welding the filament and the adapter.

Example 23 includes the subject matter of Example 22, and further includes: prior to the clamping the filament, wrapping the adapter around the filament.

Example 24 includes the subject matter of any of Examples 22-23, and further specifies that the two clamping acts result in the filament, the adapter, and the electrode all clamped together before any of the welding acts is performed.

Example 25 includes the subject matter of any of Examples 22-24, and further specifies that the two welding acts are performed as a single operation.

Example 26 includes the subject matter of any of Examples 22-25, and further specifies that at least one of the welding acts is electrical spot welding.

Example 27 includes the subject matter of any of Examples 22-26, and further specifies that at least one of the welding acts is laser welding.

Example 28 includes the subject matter of any of Examples 22-27, and further specifies that at least one of the welding acts comprises delivering a single pulse of energy.

Example 29 includes the subject matter of any of Examples 20-28, and further includes forming a nanorod tip at a distal end of the electrode subsequent to the welding of the electrode.

Example 30 includes the subject matter of any of Examples 20-28, and further includes forming a nanorod tip at a distal end of the electrode prior to the welding of the electrode.

Example 31 includes the subject matter of any of Examples 20-30, and further specifies that the adhering includes depositing the adapter onto the filament.

Example 32 is a procedure, including: forming an emitter assembly by the method of Example 20; forming a nanorod tip at a distal end of the electrode before or after the welding act; and installing the emitter assembly, with the nanorod tip, in an electron microscope.

Example 33 includes the subject matter of Example 32, and further includes: generating an electric field at a tip of the electrode to produce an electron beam in the electron microscope.

Example 34 is a structure, including: a filament having a first material composition; a rare-earth hexaboride electrode comprising: a microrod adjacent to a second fusion zone; and at a distal end, a nanorod tip; and an adapter having: a thickness in a range 5-100 μm; and a second material composition having at least 80 at % tantalum, the second material composition being distinct from the first material composition; a first fusion zone coupling the filament to the adapter; and the second fusion zone, which couples the electrode to the adapter.

Example 35 is an electron microscope, including a cold field emission electron source comprising the structure of Example 34.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase. Terms joined by "or" or "and/or" need not be mutually exclusive.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "accelerate," "acquire," "adhere," "analyze," "apply," "clamp," "clean," "configure," "deliver," "deposit," "determine," "direct," "drive," "form," "fuse," "generate," "indicate," "install," "mill," "obtain," "provide," "receive," "scan," "transmit," "use," or "weld" to describe the disclosed techniques. These terms are high-level abstractions of the actual operations that are performed. The actual operations that correspond to these terms may vary depending on the particular implementation and are readily discernible by one of ordinary skill in the art having this disclosure at hand.

In some examples, values, procedures, or apparatus may be referred to as "lowest", "best", "maximum," "optimum," "extremum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). Computer-readable storage media include memory and storage. The terms computer-readable media or computer-readable storage media do not include signals and carrier waves. In addition, the terms computer-readable media or computer-readable storage media do not include communication ports.

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

The disclosed technology is not limited to any particular computer or type of hardware. Certain details of suitable computers and hardware are well known and need not be set forth in detail in this disclosure.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. A structure, comprising:
a filament;
an adapter;
a first fusion zone coupling the filament to the adapter;
an electrode; and
a second fusion zone coupling the electrode to the adapter.

2. The structure of claim 1, wherein:
atomic percentages of tungsten and rhenium in the filament sum to at least 50.

3. The structure of claim 1, wherein:
the first fusion zone comprises an admixture of first material of the filament and second material of the adapter.

4. The structure of claim 1, wherein:
atomic percentage of tantalum in the adapter is at least 90.

5. The structure of claim 1, wherein:
the second fusion zone comprises an admixture of first material of the electrode and second material of the adapter.

6. The structure of claim 1, wherein:
the electrode comprises a rare-earth hexaboride material.

7. The structure of claim 1, wherein the electrode comprises:
a microrod adjacent to the second fusion zone; and
at a distal end, a nanorod tip.

8. An electron source, comprising:
the structure of claim 1, having an emitter formed at a tip of the electrode;
an extraction anode having a first aperture around a centerline of the emitter;

an acceleration anode having a second aperture around the centerline of the emitter;
at least four electrical terminals configured to receive electrical power to:
  drive current through the filament;
  apply an extraction voltage to the extraction anode; and
  apply an acceleration voltage to the acceleration anode.

9. An electron microscope, comprising:
the electron source of claim 8.

10. A structure, comprising:
a filament having a first material composition;
a rare-earth hexaboride electrode comprising:
  a microrod adjacent to a second fusion zone; and
  at a distal end, a nanorod tip; and
an adapter having:
  a thickness in a range 5-100 µm; and
  a second material composition having at least 80 at % tantalum, the second material composition being distinct from the first material composition;
a first fusion zone coupling the filament to the adapter; and
the second fusion zone, which couples the rare-earth hexaboride electrode to the adapter.

11. An electron microscope, comprising:
a cold field emission electron source comprising the structure of claim 10.

* * * * *